United States Patent [19]
Ukawa et al.

[11] Patent Number: 6,147,633
[45] Date of Patent: Nov. 14, 2000

[54] ANALOG-TO-DIGITAL CONVERTER HAVING OFFSET REMOVING FUNCTION

[75] Inventors: Masayuki Ukawa, Sagamihara; Hideki Kanayama, Atsugi, both of Japan

[73] Assignee: Burr-Brown Corporation, Tucson, Ariz.

[21] Appl. No.: 09/079,008

[22] Filed: May 14, 1998

[30] Foreign Application Priority Data

May 15, 1997 [JP] Japan .................................. 9-125774

[51] Int. Cl.$^7$ ...................................................... H03M 3/00
[52] U.S. Cl. ............................................ 341/143; 341/131
[58] Field of Search .................................... 341/131, 143, 341/168, 166, 120; 84/622

[56] References Cited

U.S. PATENT DOCUMENTS

| | | | |
|---|---|---|---|
| 4,943,807 | 7/1990 | Early et al. | 341/120 |
| 5,018,429 | 5/1991 | Yamaya et al. | 84/622 |
| 5,144,308 | 9/1992 | Norsworthy | 314/143 |
| 5,327,137 | 7/1994 | Scheerer et al. | 341/168 |

OTHER PUBLICATIONS

AD1877 Single Supply 16–Bit ΣΔ Stereo ADC, Analog Devices, pp. 1–17.

CS5330/CS5331 8–Pin, Stereo A/D Converter for Digital Audio, Crystal Semiconductor Corporation, Jan. 1995, pp. 1–14.

AK4520 20 Bit Stereo ΔΣ ADC & DAC, Asahi Kasei, Rev 2.0, 1996/9, pp. 1–20.

AK5391 Enhanced Dual Bit ΔΣ 24 Bit ADC, Asahi Kasei, Rev. 1.0, 1995/02, pp. 1–14.

AK5350 Enhanced Dual Bit ΔΣ 20 Bit A/D Converter, Asahi Kasei, 1996/01, pp. 1–15.

AK5340 Offset Calibration, Asahi Kasei, 1995/02, pp. 1–18.

AK4510 Offset Calibration, Asahi Kasei, 1994/5, pp. 1–11.

TLC320AD57C Sigma–Delta Stereo Analog–to–Digital Converter, Texas Instruments, 1995, 16 pages.

TDA1309H Low–Voltage Low–Power Stereo Bitstream ADC/DAC, Philips Semiconductors, Jun. 3. 1996, pg. 2 and 3.

*Primary Examiner*—Howard L. Williams
*Assistant Examiner*—Joan B. Jeanglaude
*Attorney, Agent, or Firm*—Cahill, Sutton & Thomas, P. L.C.

[57] ABSTRACT

In a delta-sigma type analog-to-digital converter, an offset varying during operation is removed, and a reduction in time required to generate a stable value after powering on the converter is achieved. A high pass filter is provided with a variable filter coefficient which can vary during operation. A filter coefficient controller supplies a coefficient control signal to the high pass filter to change the variable filter coefficient during operation, thereby altering the time constant of the high pass filter.

19 Claims, 9 Drawing Sheets

ΔΣ ANALOG-TO-DIGITAL CONVERTER A

ANALOG-TO-DIGITAL CONVERTER HAVING OFFSET REMOVING FUNCTION

BACKGROUND OF THE INVENTION

1. Field of the Invention

The present invention relates generally to a delta-sigma ($\Delta\Sigma$) type analog-to-digital converter, and more particularly to removal of a DC component in a $\Delta\Sigma$ type analog-to-digital converter.

2. Description of Related Art

Prior art approaches for removing a DC component or offset employed in conventional $\Delta\Sigma$ type analog-to-digital converters (A/D converters) may be roughly classified into two types: an offset calibration method and a method utilizing a high pass filter. An example of the offset calibration method is disclosed in U.S. Pat. No. 4,943,807 in which an offset value of a $\Delta\Sigma$ A/D converter is stored in a memory, and subtracted from a digitally converted value (a value after passing through a $\Delta\Sigma$ modulator and a decimation filter) to remove the DC component. The second approach utilizing a high pass filter passes a digitally converted value through a high pass filter to remove a DC component possibly included in the digitally converted value.

In the offset calibration method, if certain external factors or the like cause an offset value to change during a long time operation of an A/D converter, a difference between a value initially stored in a memory and the changed offset value is produced, thereby preventing complete removal of an associated DC component. The high pass filter approach, on the other hand, is effective to remove an offset varying during operation of an A/D converter as well. However, since the high pass filter approach utilizes a filter having an extremely low cut-off frequency which is characteristic required to remove a DC component, it takes a long time to remove the first DC component from the start of operation of the filter. Such a removal time, in fact, occupies a substantial portion within a total time required from power-on of the A/D converter to output of a stable correct value.

SUMMARY OF THE INVENTION

It is therefore an object of the present invention to provide a $\Delta\Sigma$ analog-to-digital converter which is capable of removing a varying offset during operation and of minimizing a period of time required to provide a stable value after the time the converter is powered on.

To achieve the above object, the present invention provides a delta-sigma type digital-to-analog converter for receiving an analog input signal to generate a digital output signal representing the analog input signal in a digital form, comprising: a) a delta-sigma type modulator connected to receive the analog input signal for generating a modulated output; b) a decimation filter connected to receive the modulated output for generating a decimation filter output; c) a high pass filter connected to receive the decimation filter output for generating a high pass filter output, the high pass filter having a variable filter coefficient during operation; and d) filter coefficient control means connected to the high pass filter for generating a coefficient control signal for specifying a change in the variable filter coefficient during operation.

According to the present invention, the variable filter coefficients may be changed upon powering up the converter. Also, according to the present invention, the characteristic of the high pass filter may be represented by using a Z function as follows:

$$H(Z) = \frac{H_1(Z)}{H_2(Z)}$$

$$H_1(Z) = \sum_{l=0}^{M} b_l Z^{-l}$$

$$H_2(Z) = \sum_{l=0}^{N} a_l Z^{-l}$$

where $a_l$ and $b_l$ are coefficients, and M and N are positive integers, and the variable filter coefficients may include a first filter coefficient comprising a first combination of values of $a_l$ and $b_l$ and a second filter coefficient comprising a second combination of values of $a_1$ and $b_1$, where the second combination is different from the first combination. Further, according to the present invention the high pass filter is a first-order filter, the characteristic of which is represented by using a Z function as follows:

$$H(Z) = \frac{H_1(Z)}{H_2(Z)}$$

$$H_1(Z) = 1 - Z^{-1}$$

$$H_2(Z) = 1 - kZ^{-1}$$

where k is a coefficient, and the variable filter coefficient may include a first filter coefficient comprising a first value of k and a second filter coefficient comprising a second value of k. In this case, the first filter coefficient has a value close to one; and the second filter coefficient has a value equal or close to zero.

Further, according to the present invention, the high pass filter comprises: a) a subtracter having a first input connected to receive the decimation filter output, a second input, and an output; b) delay means having an input connected to the output of the subtracter and an output; c) an adder having a first input connected to receive the decimation filter output, a second input connected to the output of the delay means, and an output for generating the high pass filter output; and d) a feedback circuit having an input connected to the output of the adder, and an output connected to the second input of the subtracter, the feedback circuit having a variable feedback coefficient during operation, the feedback coefficient acting as the filter coefficients.

According to the present invention, the feedback circuit may be of an adder type or of a multiplier type.

Also, according to the present invention, the filter coefficient control means may include timing control means for supplying a first timing signal as the coefficient control signal; and the first timing signal may indicate that the second filter coefficient is to be used during a first predetermined period of time after the time the converter is reset. In this event, the delta-sigma type analog-to-digital converter may further comprise dither control means for controlling the application of a DC dither component to the input of the delta-sigma modulator. In this case, the timing control means may further generate a second timing signal supplied to the dither control means, and the second timing signal may indicate that the DC dither component is not to be applied during a second predetermined period of time after the converter is reset, where the second predetermined period of time is shorter than the first predetermined period of time.

BRIEF DESCRIPTION OF THE DRAWINGS

The present invention will hereinafter be described in detail in connection with preferred embodiments thereof with reference to the accompanying drawings.

DESCRIPTION OF THE PREFERRED EMBODIMENTS

Figure 1:
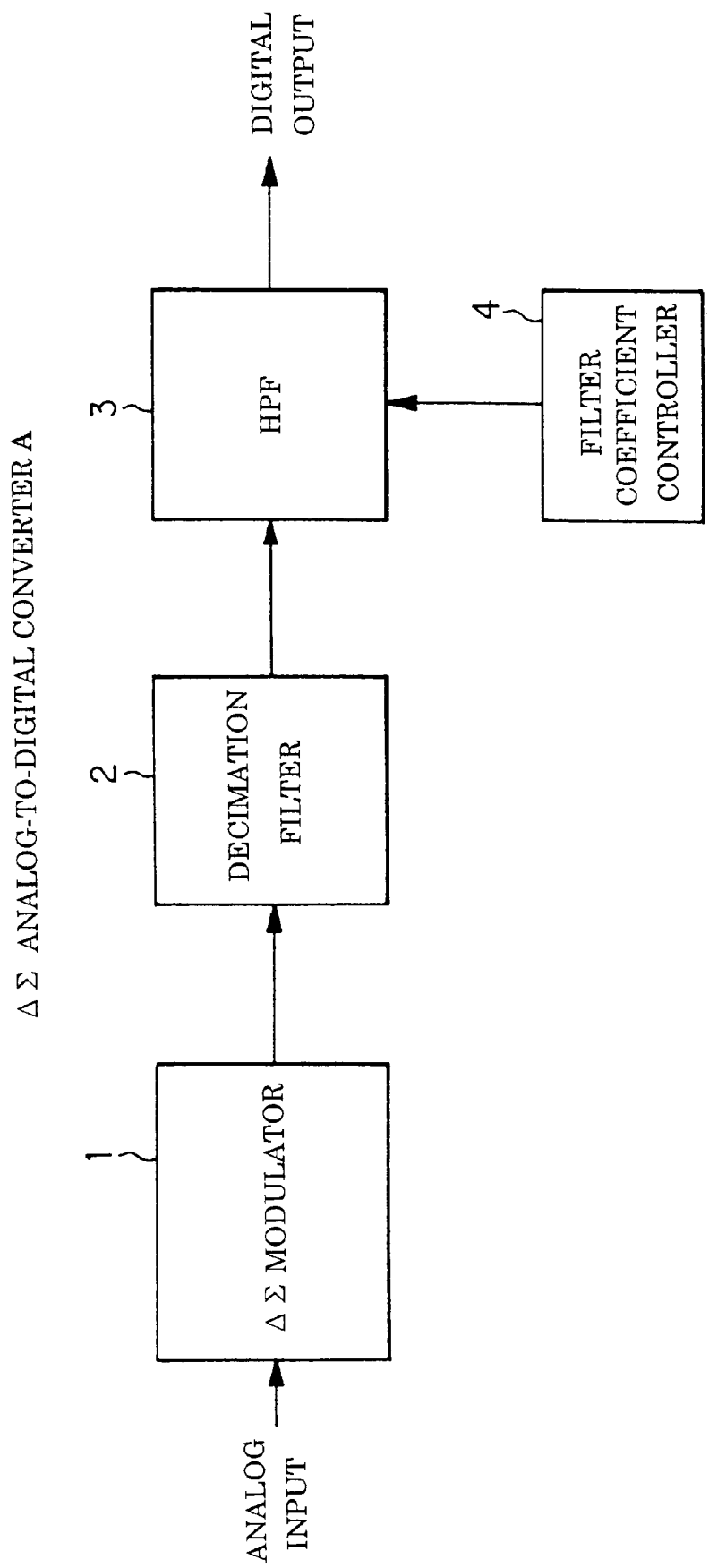
FIG. 1 is a block diagram illustrating a ΔΣ type analog-to-digital converter A according to a first embodiment of the present invention.

FIG. 1 is a block diagram illustrating a first embodiment A of a ΔΣ type analog-to-digital (A/D) converter according to the present invention. As illustrated, the converter A comprises a ΔΣ modulator 1, a decimation filter 2, a high pass filter (HPF) 3, and a filter coefficient controller 4. The ΔΣ modulator 1 receives an analog input to be converted into a digital form at its input, and generates a modulated output, after being subjected to ΔΣ modulation, at its output. The modulated output is received by the decimation filter 2 at its input, which decimates the input to generate the result at its output.

The subsequent HPF 3 has an input, a control input and an output, and also has a group of variable filter coefficients. The characteristic of the HPF 3 is generally represented using a Z function as follows:

$$H(Z) = \frac{H_1(Z)}{H_2(Z)}$$

$$H_1(Z) = \sum_{l=0}^{M} b_l Z^{-l}$$

$$H_2(Z) = \sum_{l=0}^{N} a_l Z^{-l}$$

where $a_l$ and $b_l$ are coefficients, and M and N are positive integers. The variable filter coefficients are constituted by a first group of filter coefficients comprising a first combination of $a_l$ and $b_l$ values and a second group of filter coefficients comprising a second combination of $a_l$ and $b_l$ values which are different from those of the first combination. The filter coefficients are such that the time constant of the HPF 3 is larger as the cut-off frequency of the HPF 3 approaches to zero. Conversely, the time constant becomes smaller as the cut-off frequency of the HPF 3 becomes higher. The HPF 3 receives the output of the decimation filter 2 at its input, a signal for controlling the filter coefficient at its control input, and generates the result of high pass filtering performed on the received decimation filter output with specified filter coefficients. The filter coefficient controller 4 has its output connected to the control input of the HPF 3, so that the filter coefficient controller 4 supplies the HPF 3 with the filter coefficient control signal to cause the HPF 3 to use appropriate values as the HPF coefficients.

The configuration described above enables the HPF 3 to execute the filtering using a group of filter coefficients specified by the controller 4 during an A/D converting operation of the A/D converter A, thereby making it possible to execute the high pass filtering with an appropriate time constant or a cut-off frequency in accordance with a particular operating situation. In this way, a large value may be used as the filter time constant when an offset of the A/D converter is to be removed, while a smaller value may be used as the time constant of the HPF 3 when a digital output is to be stabilized as soon as possible, for example, when the A/D converter A is powered on.

Figure 2:
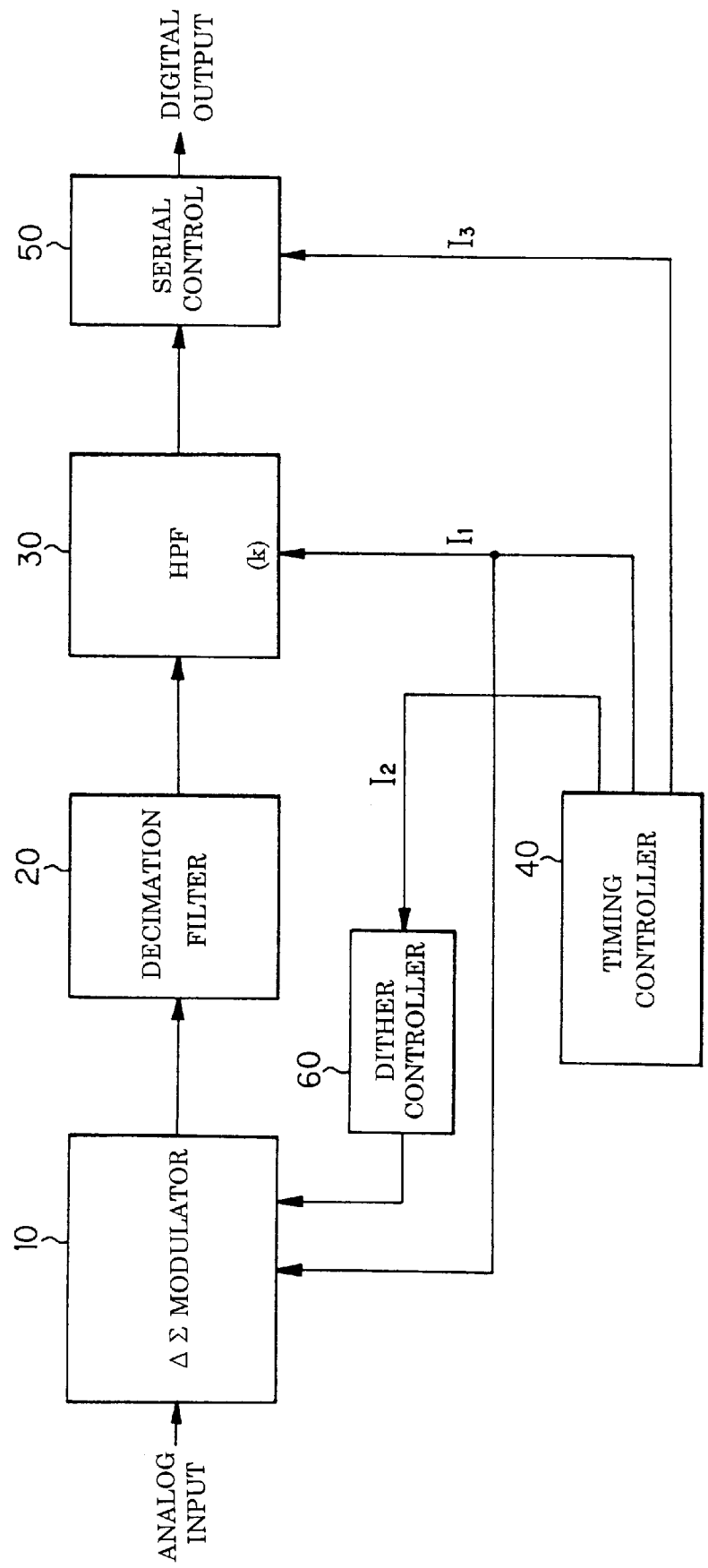
FIG. 2 is a block diagram illustrating a ΔΣ type analog-to-digital converter B according to a second embodiment of the present invention.

With reference now to FIG. 2, a ΔΣ analog-to-digital converter B according to a second embodiment of the present invention will be described below. The converter B, which comprises the converter A shown in FIG. 1 with a portion thereof being more specific, includes a ΔΣ modulator 10, a decimation filter 20 and a HPF 30, similar to the components 1, 2 and 3 in FIG. 1 respectively. Also, the converter B includes a timing controller 40 partially corresponding to the filter coefficient controller 4 (FIG. 1), a serial controller 50 and a dither controller 60. In the second embodiment, the HPF 30 comprises a first-order filter, the characteristic of which can be represented using a Z function as follows:

$$H(Z) = \frac{H_1(Z)}{H_2(Z)}$$

$$H_1(Z) = 1 - Z^{-1}$$

$$H_2(Z) = 1 - kZ^{-1}$$

where k is a coefficient. The coefficient k is a variable coefficient as mentioned above. In this embodiment, a first filter coefficient equal to a first value of k and a second filter coefficient equal to a second value of k are used. The filter coefficient k may take a value, for example, in the range of zero to one. As the value of the filter coefficient k approaches zero, the time constant of the HPF 30 becomes larger, with the cut-off frequency of the HPF 30 being closer to zero. On the contrary, as the filter coefficient approaches zero, the time constant of the HPF 30 becomes smaller, with the cut-off frequency of the HPF 30 becoming higher.

The serial controller 50 converts a parallel filter output from the HPF 30 into a serial form. As is known in the art, the dither controller 60 controls the application of a DC bias voltage (a bias voltage source (not shown) is provided within the ΔΣ modulator 10) of a certain magnitude to an analog input received at an input of the ΔΣ modulator 10, so that the tone frequency is moved out of an audio frequency band. In this embodiment, the ΔΣ modulator 10 also has first and second control inputs which are connected to receive a signal from the timing controller 40 and a control input from the dither controller 60, respectively. The first control input opens or closes an input gate (not shown) which is provided to receive an analog input to the modulator 10. The second control input opens or closes an input gate (not shown) which is provided to pass a dither to an adder (not shown) for the addition of the dither to the received analog input. The serial controller 50 also has a control input which activates its serial digital output depending upon the logical state of the control input.

The timing controller 40 generates several timing signals to control the operation of the converter B. A first timing signal I1 is supplied to the control input of the HPF 30 and to the first control input of the modulator 10. A second timing signal I2 is supplied to the input of the dither controller 60, while a third timing signal I3 is supplied to the control input of the serial controller 50.

Now, with reference to FIG. 3, a circuit configuration of the HPF 30 will be described. As seen, the HPF 30 comprises a subtracter 32, a one-clock delay 34, an adder 36, and a feedback circuit 38. The converter B is operated with a clock having a frequency of 44.1 KHz. The subtracter 32 receives at its negative input a 28-bit binary input X which is the output of the decimation filter 20 (see FIG. 2). The subtracter 32 subtracts the input X from a value received at its positive input to generate the subtraction result as a 28-bit binary output. The output of the subtracter 32 is supplied to one of positive inputs of an adder 36 which also receives the input X at the other positive input. The adder 36 adds both the inputs to generate the addition result as a 28-bit binary output Y. The output Y is supplied to the input of the subsequent serial controller 50 (see FIG. 2). The output Y is also supplied as an input A of the feedback circuit 38 which generates a binary feedback output B applied to the positive input of the subtracter 32.

Figure 3:
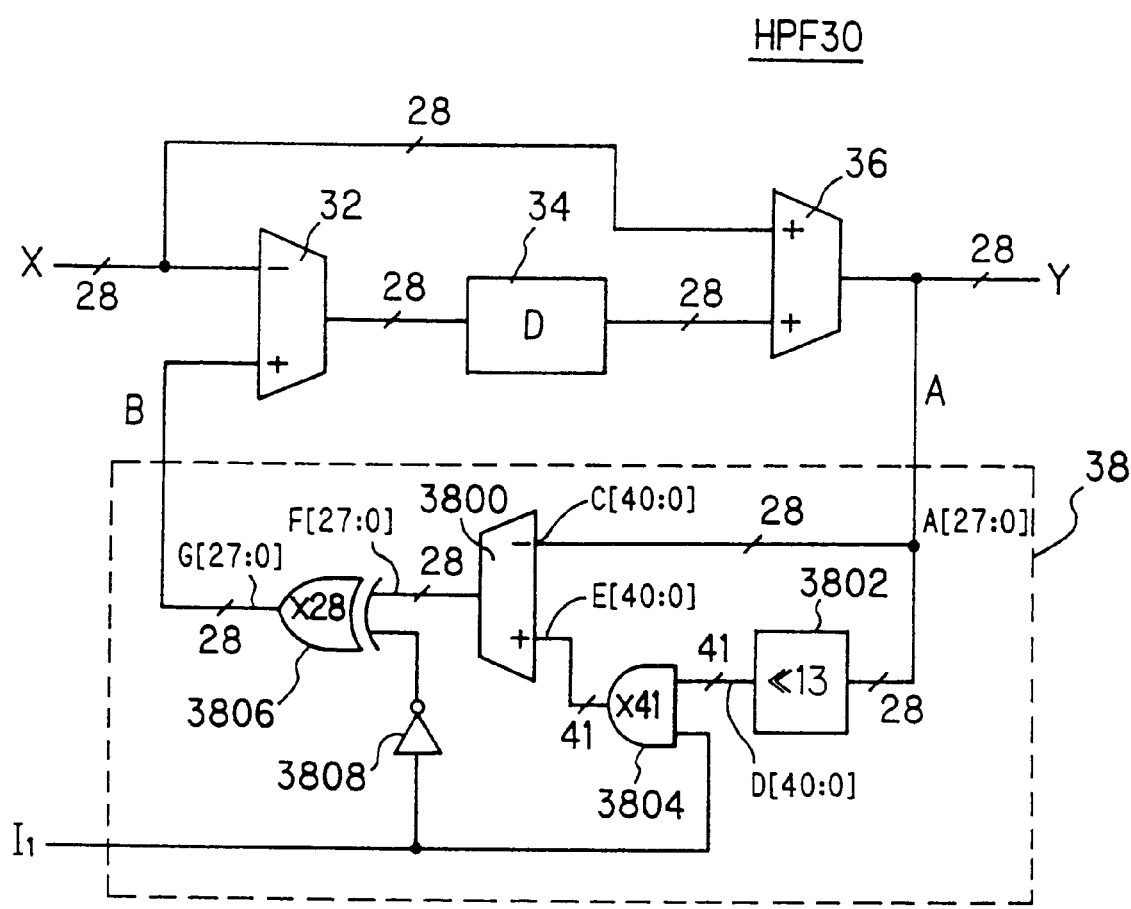
FIG. 3 is a circuit diagram illustrating in detail a high pass filter shown in FIG. 2.

One embodiment of the feedback circuit 38 according to the present invention shown in FIG. 3 is an adder type in which two non-zero filter coefficients (or feedback coefficients) k1 and k2 are selectively used. The filter coefficient k1 is "8191/8192" and therefore approximately equals to one, while the filter coefficient k2 is "1/8192" and therefore is approximately equal to zero. More specifically, the feedback circuit 38 comprises an adder 3800, a shift circuit 3802 for shifting an input to the left by 13 bits (represented by "<<13"), 41 (indicated by "X41") AND gates 3804, 28 (indicated by "X28") exclusive OR (EX-OR) gates 3806, and an inverter 3808. The adder 3800 internally generates a 41-bit binary signal C[40:0] from a 28-bit input A[27:0] received at its negative input by extending the most significant bit (MSB) of the input A[27:0]. In other words, the input A is multiplied by one while extending its bit length to 41 bits (it should be noted that binary signals are represented by a two's compliment). Thus, each bit in a portion [40:28] of the extended binary signal C[40:0] is equal to the bit A[27], while bits C[27:0] are equal to the corresponding bits A[27:0], respectively. The shift circuit 3802 shifts the input A to the left by 13 bits to multiply the input A by $2^{13}$ (=8192) to produce a 41-bit binary signal D[40:0]. Thus, bits D[40:13] equals to bits A[27:0]. Bits D[12:0] are all equal to zero. The AND gates 3804, each of which receives a corresponding one of the 41-bit output at one input thereof, performs a logical AND operation of the bit and a timing signal, whereby the entire AND gates 3804 generate the results as E[40:0]. Specifically, E[40:0] are all zero when I1 is low (I1="0"), while E[40:0] is equal to D[40:0] when I1 is high (I1="1").

The adder 3800 subtracts the binary signal C[40:0] from the binary signal E[40:0] to generate only the upper 28 bits of the subtraction result as F[27:0]. Since the lower 13 bits are not used, this is equivalent to a multiplication by $2^{-13}$. The signal F at this time is equal to (E−C)/8192. Thus, when I1=1, F=(8192·A−A)/8192=(8191/8192)A=k1·A. On the other hand, when I1=0, F=−A(1/8192)=−k2·A. In the latter case where I1=0, since the binary signal F takes a negative value, the binary signal F is inverted by the EX-OR gates at the next stage such that a positive binary output G[27:0] is always provided. This binary output G[27:0] serves as the B[27:0]. As a conclusion, when I1=0, the binary signal B (i.e., B=k2·A) is substantially equal to zero, rendering the time constant of the HPF very small. On the other hand, when I1=1, the binary signal B (i.e., B=k1·A) is substantially equal to A, resulting in an extremely large time constant required to remove a DC offset.

Figure 4:
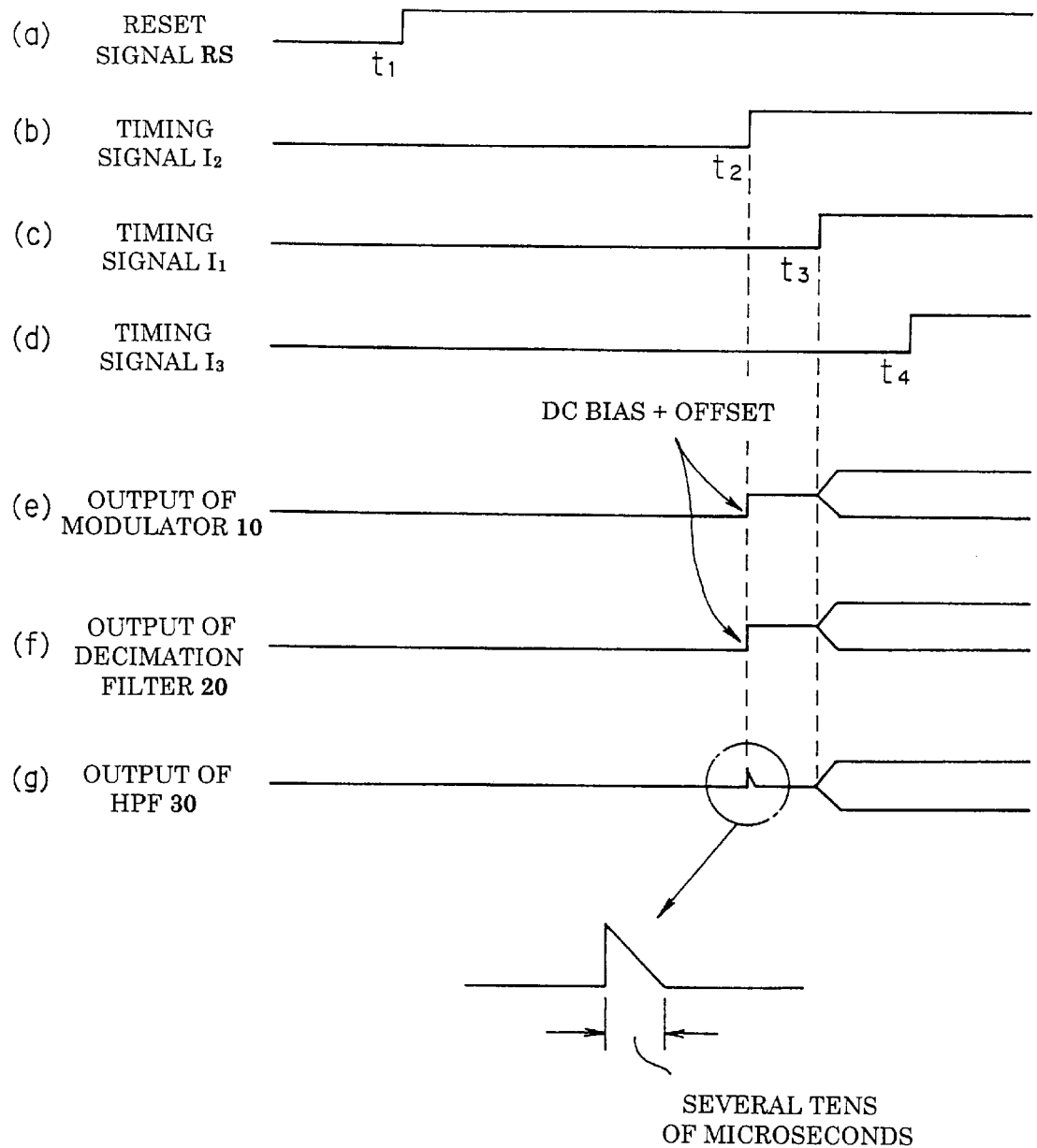
FIG. 4 is a timing diagram for explaining the operation of the entire ΔΣ analog-to-digital converter of FIG. 2 having the high pass filter of FIG. 3.

With reference to FIG. 4, the operation of the entire ΔΣ A/D converter of FIG. 2 including the high pass filter circuit shown in FIG. 3 will be described. First, as seen in (a) of FIG. 4, a reset signal RS (not shown in FIG. 2) which is applied to the timing controller 40 from a system using the A/D converter of the invention, transitions from low to high at time t1 due to the A/D converter being powered on. Based on the high reset signal RS, the timing controller 40 forms and generates the timing signals I1, I2 and I3 as shown in (c), (b) and (d) of FIG. 4, respectively. The timing signals I1, I2 and I3 are initially at low. Thus, the input gate of the modulator 10 for receiving an analog input is closed, and the input gate within the modulator 10 for the application of a DC dither is also closed. Further, because of I1=0, the HPF 30 takes the filter coefficient k2 (substantially zero). Moreover, a digital output of the serial controller 50 is not yet activated. With this condition, the timing signal I2 first transitions from low to high at time t2, for example, 300 milliseconds after time t1, whereby the dither controller 60 causes a DC bias to be added to the analog input within the modulator 10. This causes a DC component comprising a combination of the DC dither bias and an offset to appear at the output of the modulator 10 and the output of the decimation filter 20 (see (e) and (f) of FIG. 4) at and after time t2. At this time, as illustrated in (g) of FIG. 4, noise, which abruptly rises and gradually lowers as illustrated (see an enlarged view given below (g) of FIG. 4), appears at the output of the HPF 30 for several tens of microseconds and then the DC component is completely removed. In the prior art, the period of time in which such noise appears, lasts one–two seconds due to the coefficient value of the HPF close to one in the prior art. According to the present invention, such a period of time can be reduced to one which is extremely reduced, i.e., several tens of microseconds.

At time t3, for example, 20 milliseconds after time t2, the timing signal I1 transitions to high. This opens the input gate of the ΔΣ modulator 10 to start A/D conversion of an analog input, while at the same time the filter coefficient of the HPF 30 is switched from k1 to k2 (substantially one). As a result, the offset removing function in the A/D conversion is fully activated. At time t4 which is another 20 milliseconds after time t3, the timing signal I3 transitions from low to high, causing the digital output of the serial controller 50 to be active, whereby the A/D converted output is generated in a serial form.

The A/D converter according to one embodiment of the present invention has been described above. The feedback circuit portion of the HPF 30 can be implemented by a variety of circuit configurations, some of which will be described for the purpose of illustration.

Figure 5:
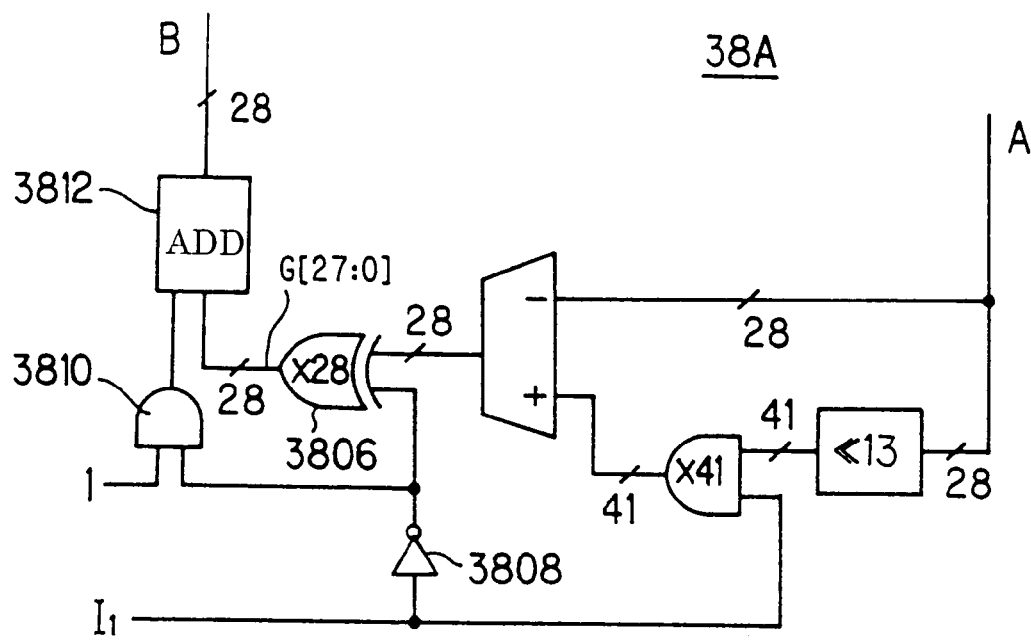
FIG. 5 is a circuit diagram illustrating a circuit 38A which is a second embodiment of a feedback circuit 38 within the high pass filter 30 of FIG. 3.

FIG. 5 illustrates a circuit 38A according to a second embodiment of the feedback circuit 38 of the HPF 30. The embodiment shown in FIG. 5 is intended to provide a circuit free from a one-bit error which can occur in the circuit of FIG. 3. The one-bit error occurs in the circuit of FIG. 3 when a binary signal is inverted by the EX-OR gates in FIG. 3, due to the binary signal represented by a two's complement. Since the one-bit error occurs only during the use of the second coefficient k2, i.e., up to time t3 in FIG. 4 (during I1=0), this does not cause substantially any digital output error. However, it is possible to form a circuit which can prevent such one-bit error.

Specifically, the feedback circuit 38A of FIG. 5 includes an AND gate 3810 and an adder 3812 in addition to the circuit 38 of FIG. 3.

The AND gate 3810 receives the output of the inverter 3808 at one of the inputs and a binary "1" signal at the other input. The output of the AND gate 3810 is received by one of the inputs of the adder 3812 which also receives the output G[27:0] from the EX-OR gates 3806 at the other input. When I1=0, the output of the inverter 3808 goes high, causing the output of the AND gate 3810 to go high or transition to logical "1" which is added to the least significant bit of the output G of the EX-OR gates 3806 by the adder 3812. The addition result is generated from the adder 3812 as the aforementioned binary signal B[27:0]. In this way, the one-bit error which is due to the inversion performed by the EX-OR gates when I1=0, is removed.

Figure 6:
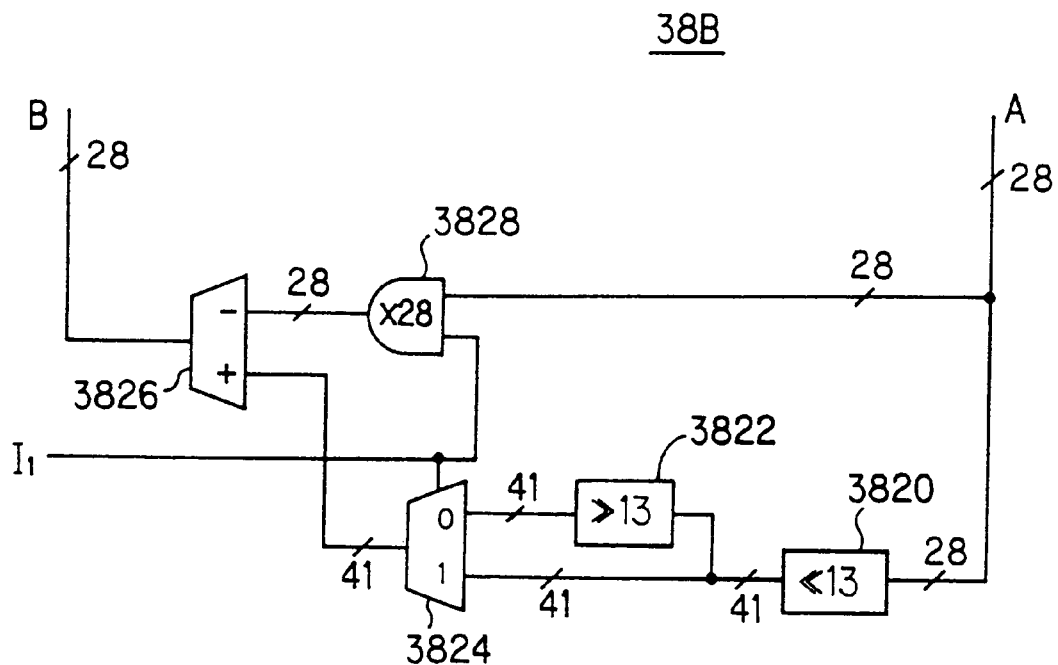
FIG. 6 is a circuit diagram illustrating a circuit 38B which is a third embodiment of the feedback circuit 38.

FIG. 6 illustrates a feedback circuit 38B according to a third embodiment of adder type which is free from the bit error and has two coefficients k1 and k2 having the same values as the aforementioned non-zero values, i.e., "8191/8192" and "1/8192". In the feedback circuit 38B, the coefficients are realized in the following manner. A 13-bit left shift circuit 3820 multiplies an input A by 8192. The output of the shift circuit 3820 is applied to a shift circuit 3822 which shifts the output to the right by 13 bits (represented by "22 >13"), that is, divides the output by 8192, such that the output of the shift circuit 3822 is equal to the input A multiplied by one. A selector 3824 at the next stage receives the output of the shift circuit 3820 at a "1" input, the output of the shift circuit 3822 at a "0" input, and the timing signal I1 at a selection control input. Thus, the selector 3824 outputs the input A multiplied by one when I1=0, and outputs the input A multiplied by 8192 when I1=1. An output of the selector 3824 is connected to a positive input of an adder 3826 which has a negative input connected to outputs of a set of 28 AND gates 3828. Each of the AND gates 3828 receives a corresponding bit of the input A at one of the inputs and the timing signal I1 at the other input. Thus, the output from the AND gates is zero when I1=0 and the input A multiplied by one when I1=1. It should be noted that the adder 3826 is similar to the adder 3800 in FIG. 3. Thus, the adder 3826 performs bit extension at its negative input, and provides an output formed only by the most significant 28 bits of the 41 bits such that the adder 3826 has a function of performing a multiplication by 1/8192. As a result, in the adder 3826, when I1=0, the positive input is 1·A, the negative input is zero, and the output is (1·A−0)8192=(1/8192)A=k2·A. On the other hand, when I1=1, the positive input is 8192·A, the negative input is 1·A, and the output is (8192·A−1·A)8192=(8191/8192)A=k1·A. It will be understood that the output B identical to that in FIG. 5 can be derived without inversion performed by EX-OR gates.

Figure 7:
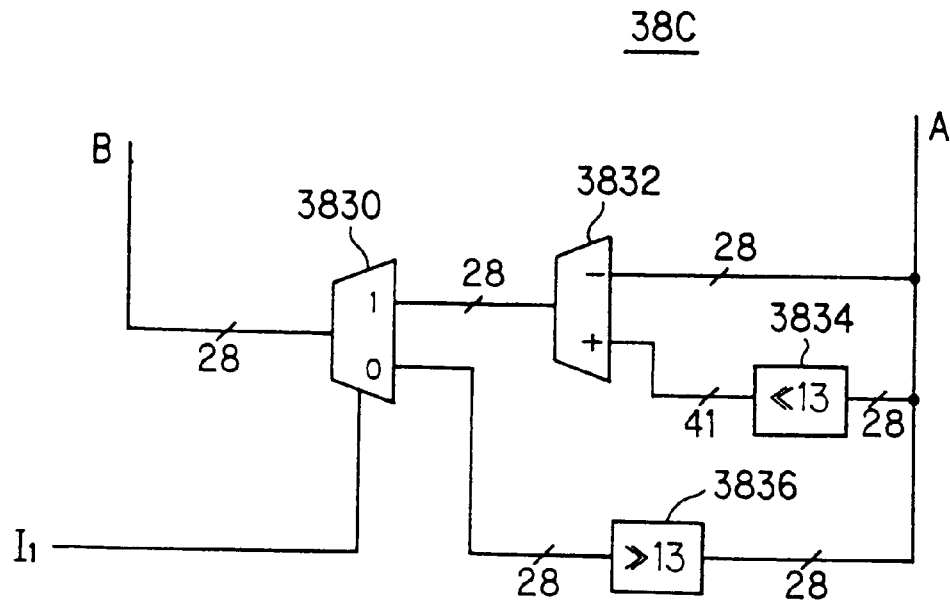
FIG. 7 is a circuit diagram illustrating a circuit 38C which is a fourth embodiment of the feedback circuit 38.

FIG. 7 illustrates a feedback circuit 38C according to a fourth embodiment for use in the HPF 30, which is also an adder type one free from bit error and having non-zero coefficients. The feedback circuit 38C realizes a coefficient k1 using a signal at a "1" input terminal of a selector 3830 and a coefficient k2 using a signal at a "0" input terminal of the selector 3830. Explaining first the "1" input side, an adder 3832 which is similar to the adder 3800 in FIG. 3, has a negative input connected to receive an input A multiplied by one and a positive input connected to receive 8192·A generated by a 13-bit left shift circuit 3834 placed at the preceding stage. Thus, the adder output is represented by (8191/8192)A=k1·A. On the other hand, the "0" input terminal of the selector 3830 receives (1/8192)·A generated by a 13-bit right shift circuit 3836. The selector 3830 delivers k2·A at its "0" input terminal to its output terminal when I1=0, and k1·A at its "1" input terminal to its output terminal when I1=1. In this way, a function similar to that provided by the feedback circuit shown in FIG. 5 is realized.

Figure 8:
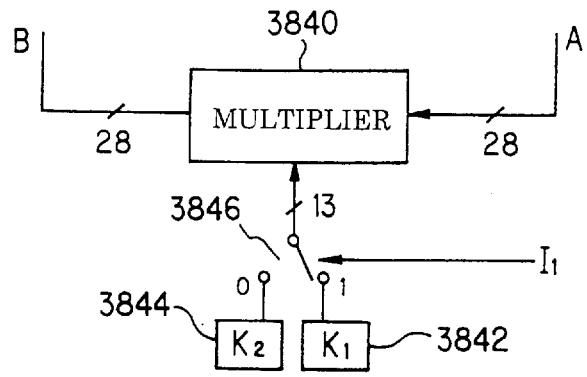
FIG. 8 is a circuit diagram illustrating a circuit 38D which is a fifth embodiment of the feedback circuit 38.

Now, with reference to FIGS. 8–10, several feedback circuits of multiplier type having non-zero coefficients will be described. Referring first to FIG. 8, a feedback circuit 38D comprises a multiplier 3840, a k1 coefficient circuit 3842, a k2 coefficient circuit 3844 and a switch 3846. The multiplier 3840 receives a signal A at its input and generates a signal B at its output. The multiplier 3840 has a coefficient input connected to receive the output of the switch 3846. A "1" input terminal of the switch 3846 is connected to receive a coefficient k1 in the form of 13-bit binary signal from the k1 coefficient circuit 3842, while a "0" input terminal of the switch 3846 is connected to receive a coefficient k2 in the form of 13-bit binary signal from the k2 coefficient circuit 3844. The control input of the switch 3846 receives a timing signal I1 such that depending upon the status of the timing signal I1, a corresponding one of the input terminals is connected to the output terminal. Thus, the multiplier 3840 provides k1·A when I1=1, and k2·A when I1=0. This embodiment has an advantage in that the coefficient values can be changes as desired.

Figure 9:
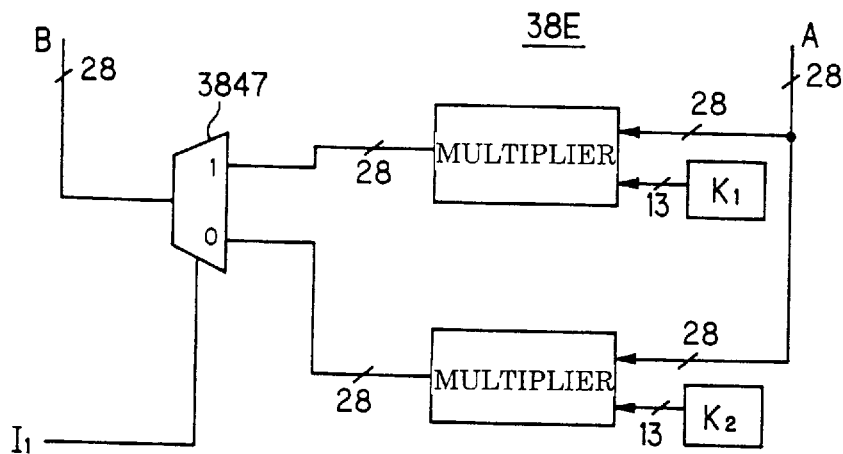
FIG. 9 is a circuit diagram illustrating a circuit 38E which is a sixth embodiment of the feedback circuit 38.

Referring next to FIG. 9, it is shown a feedback circuit 38E. This circuit 38E is the same as the feedback circuit 38D of FIG. 8 except that two multipliers are provided with a coefficient circuit being associated with each multiplier, and that a selector 3847 is provided for selectively generating the outputs of the two multipliers. The feedback circuit 38E also functions similar to the feedback circuit 38D, and can advantageously set the coefficient values as desired.

Figure 10:
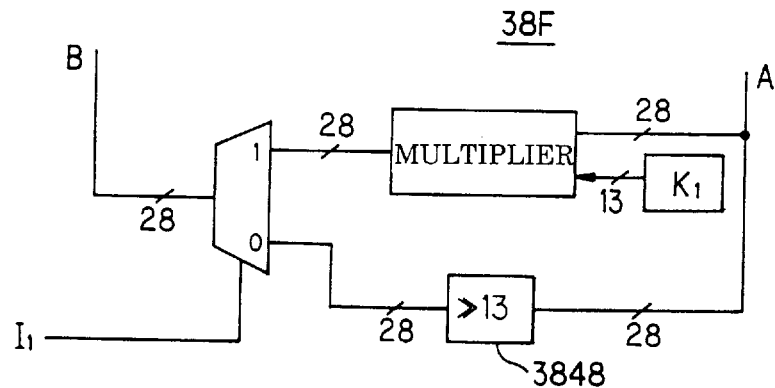
FIG. 10 is a circuit diagram illustrating a circuit 38F which is a seventh embodiment of the feedback circuit 38.

Referring now to FIG. 10, it is shown a feedback circuit 38F. This circuit 38F is the same as the feedback circuit 38E of FIG. 9 except that a combination of the multiplier and the k2 coefficient circuit is replaced with a ">>13" shift circuit 3848. Thus, a coefficient k2 is a fixed value of 1/8192. Another coefficient k1 can be set as desired.

Next, with reference to FIGS. 11–15, several embodiments of feedback circuits with one (k2) of two coefficient k1 and k2 being equal to zero will be described. First, feedback circuits of adder type will be discussed with reference to FIGS. 11 and 12.

Figure 11:
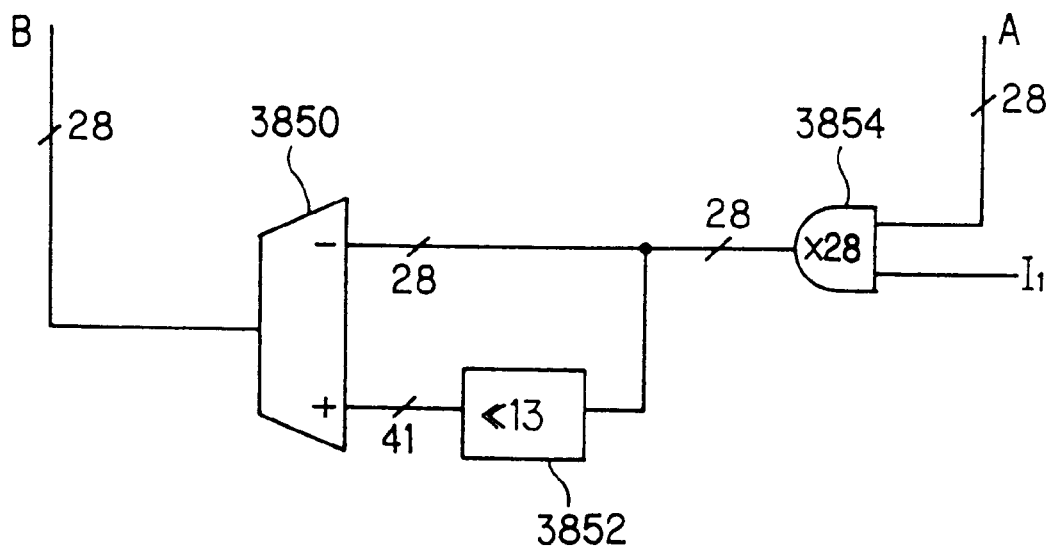
FIG. 11 is a circuit diagram illustrating a circuit 38G which is an eighth embodiment of the feedback circuit 38.

A feedback circuit 38G according to an eighth embodiment shown in FIG. 11 comprises an adder 3850 similar to the adder 3800 in FIG. 3, a "<<13" shift circuit 3852 and a set of 28 AND gates 3854. More specifically, each of the AND gates 3854 receives a corresponding bit of a binary signal A at one of the inputs and a timing signal I1 at the other input. An output from the AND gates 3854 is connected to a negative input of the adder 3850 which has its positive input connected to receive the output from the AND gates 3854 through the left shift circuit 3852. The adder 3850 generates the same output as that of the adder 3832 in FIG. 7, i.e., (8191/8192)A=k1·A when I1=1. On the other hand, when I1=0, the AND gates 3854 deliver an all-zero output, causing the adder 3850 to also generate a zero output. This means that k2 is equal to zero (k2=0).

Figure 12:
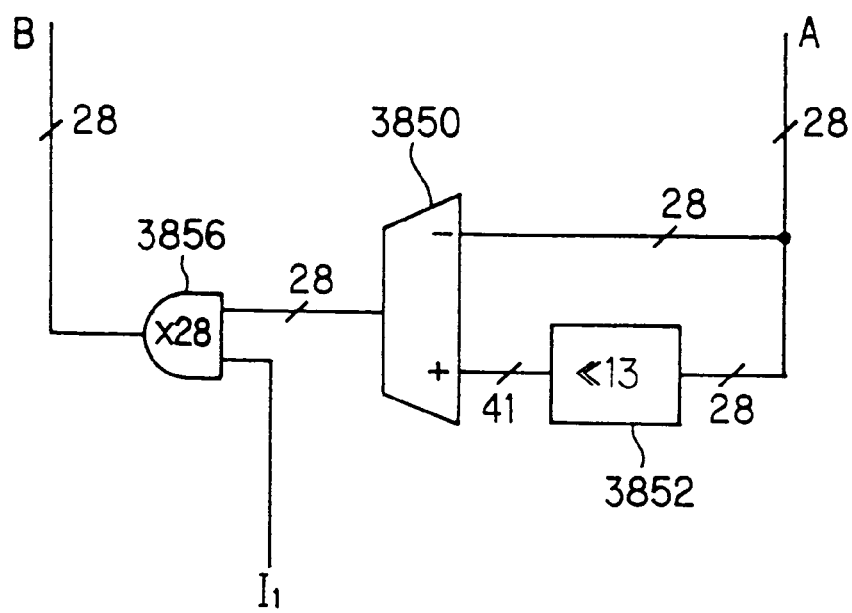
FIG. 12 is a circuit diagram illustrating a circuit 38H which is a ninth embodiment of the feedback circuit 38.

Next, a feedback circuit 38H according to a ninth embodiment shown in FIG. 12 is similar to the feedback circuit 38G of FIG. 11 except that AND gates are positioned on the output side of the adder rather than on the input side of the same. More specifically, each of AND gates 3856 has one of the inputs connected to a corresponding one of the 28 bits of the output of the adder 3850, the other input connected to a timing signal I1. The negative input of the adder 3850 and the input of the shift circuit 3852 are connected to receive a signal A. The feedback circuit 38H functions in the same manner as the feedback circuit 38G.

Figure 13:
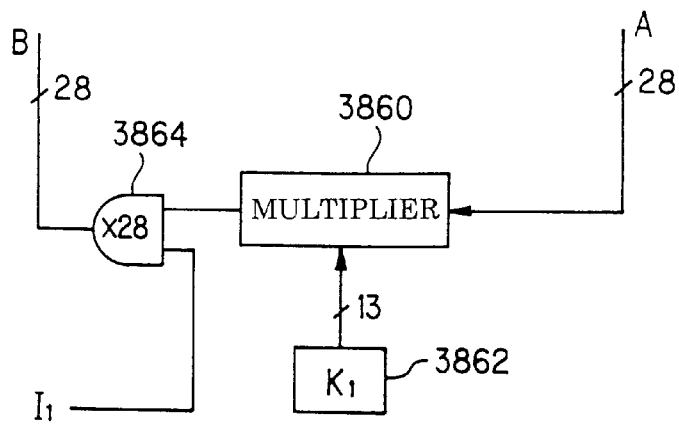
FIG. 13 is a circuit diagram illustrating a circuit 38I which is a tenth embodiment of the feedback circuit 38.

Now with reference to FIGS. 13–15, feedback circuits of multiplier type will be described. Referring first to FIG. 13, a feedback circuit 38I according to a tenth embodiment comprises a multiplier 3860 which receives a signal A at an input, a k1 coefficient circuit 3862 having an output connected to a coefficient input of the multiplier 3860, and a set of 28 AND gates 3864. Each of the AND gates 3864 has one input connected to receive a corresponding one of the 28 bits of an output of the multiplier 3860 and the other input connected to receive a timing signal I1. The illustrated feedback circuit 38I is similar to the feedback circuits of FIGS. 8 and 9 except that the coefficient k2 (=0) at the time of I1=0 is formed by the AND gates 3864.

Figure 14:
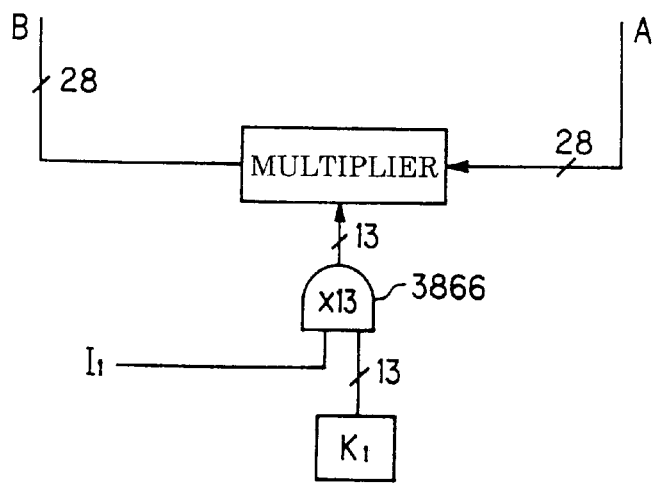
FIG. 14 is a circuit diagram illustrating a circuit 38J which is an eleventh embodiment of the feedback circuit 38.

A feedback circuit 38J according to an eleventh embodiment shown in FIG. 14 is similar to the feedback circuit 38I except that a set of 28 AND gates 3866 are not connected to the output side of a multiplier but to the coefficient input of the multiplier. Thus, the feedback circuit 38J has the same function as the feedback circuit 38I. In this embodiment, an output from the AND gates 3866 provides a coefficient k2 (=0) when I1=0.

Figure 15:
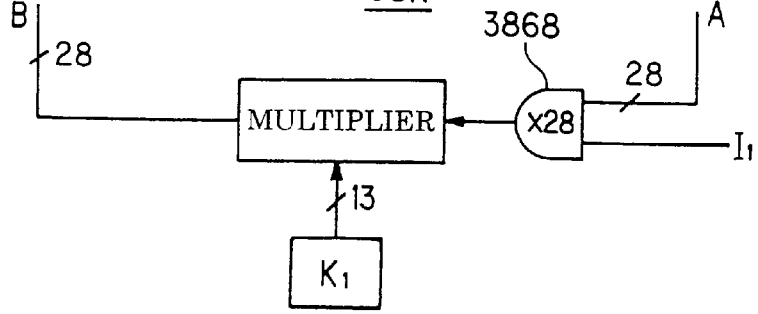
FIG. 15 is a circuit diagram illustrating a circuit 38K which is a twelfth embodiment of the feedback circuit 38.

A feedback circuit 38K according to a twelfth embodiment shown in FIG. 15 is also identical to the feedback circuit 38I of FIG. 13 except that a set of 28 AND gates 3868 are positioned on the input side of a multiplier. As described above, the feedback circuit for use in the HPF 30 can be implemented in a variety of ways, and thus an appropriate one can be employed in accordance with particular use, application, and so on.

It will be understood that a variety of modifications may be made by those skilled in the art to the foregoing embodiments of the present invention. For example, while the foregoing embodiments have been described in connection with examples of two filter coefficients, the number of filter coefficients may be larger than two or may be any other value than the foregoing value as required according to the present invention.

According to the present invention described above, the removal of varying offset and a reduction in time required to generate a stable output of an A/D converter can be realized only by switching filter coefficients of a high pass filter. In addition, as a consequence of the reduction in time required to generate a stable output when the A/D converter is powered on, the present invention advantageously reduces a time required to test A/D converters. Further, even when the A/D converter is used in an apparatus having a power down mode for saving power dissipation, the present invention is effective in reducing a time required to generate a stable output every time the apparatus is powered up for recovering from the power down mode.

What is claimed is:

1. A delta-sigma type analog-to-digital converter for receiving an analog input signal to generate a digital output signal representing the analog input signal in a digital form, comprising:

(a) a delta-sigma type modulator connected to receive said analog input signal for generating a modulated output;

(b) a decimation filter connected to receive said modulated output for generating a decimation filter output;

(c) a high pass filter connected to receive said decimation filter output for generating a high pass filter output, said high pass filter having a variable filter coefficient during operation; and (d) a filter coefficient control circuit connected to said high pass filter for generating a coefficient control signal for specifying a change in said variable filter coefficient during operation, wherein the characteristic of said high pass filter is represented by using a Z function as follows:

$$H(Z) = \frac{H_1(Z)}{H_2(Z)}$$

$$H_1(Z) = \sum_{l=0}^{M} b_l Z^{-l}$$

$$H_2(Z) = \sum_{l=0}^{N} a_l Z^{-l}$$

where $a_l$ and $b_l$ are coefficients, and M and N are positive integers, and said variable filter coefficient includes a first filter coefficient comprising a first combination of values of $a_l$ and $b_l$ and a second filter coefficient comprising a second combination of values of $a_l$ and $b_l$, said second combination being different from said first combination.

2. A delta-sigma type analog-to-digital converter according to claim 1, wherein said variable filter coefficient is changed after powering up said converter.

3. A delta-sigma type analog-to-digital converter according to claim 1, wherein said one combination of filter coefficient with high cut-off frequency becomes active during powering up of said converter and said variable filter coefficient changes to have a low cut-off frequency after powering up.

4. A delta-sigma type analog-to-digital converter according to claim 1, wherein:

said high pass filter comprises:

(a) a subtracter having a first input connected to receive said decimation filter output, a second input, and an output;

(b) a delay circuit having an input connected to the output of said subtracter and an output;

(c) an adder having a first input connected to receive said decimation on filter output, a second input connected to the output of said delay circuit, and an output for generating said high pass filter output; and (d) a feedback circuit having an input connected to the output of said adder, and an output connected to the second input of said subtracter, said feedback circuit having a variable feedback coefficient during operation, said feedback coefficient acting as said filter coefficients.

5. A delta-sigma type analog-to-digital converter according to claim 4, wherein said feedback circuit is of a multiplier type.

6. A delta-sigma type analog-to-digital converter according to claim 4, wherein said feedback circuit is of an adder type.

7. A delta-sigma type analog-to-digital converter according to claim 4, wherein:

said filter coefficient control circuit includes a timing control circuit for supplying a first timing signal as said coefficient control signal; and said first timing signal indicates that a predetermined filter coefficient is to be used during a first predetermined period of time after the time said converter is reset.

8. A delta-sigma type analog-to-digital converter according to claim 7, further comprising a dither control circuit for controlling the application of a DC dither component to the input of said delta-sigma modulator.

9. A delta-sigma type analog-to-digital converter according to claim 8, wherein:

said timing control circuit further generates a second timing signal supplied to said dither control circuit; and said second timing signal indicates that said DC dither component is not to be applied during a second predetermined period of time after said converter is reset, said second predetermined period of time being shorter than said first predetermined period of time.

10. A delta-sigma type analog-to-digital converter for receiving an analog input signal to generate a digital output signal representing the analog input signal in a digital form, comprising:

(a) a delta-sigma type modulator connected to receive said analog input signal for generating a modulated output;

(b) a decimation filter connected to receive said modulated output for generating a decimation filter output;

(c) a high pass filter connected to receive said decimation filter output for generating a high pass filter output, said high pass filter having a variable filter coefficient during operation; and (d) a filter coefficient control circuit connected to said high pass filter for generating a coefficient control signal for specifying a change in said variable filter coefficient during operation, wherein:

said high pass filter is a first-order filter, said first-order filter having a characteristic represented by using a Z function as follows:

$$H(Z) = \frac{H_1(Z)}{H_2(Z)}$$
$$H_1(Z) = 1 - Z^{-1}$$
$$H_2(Z) = 1 - kZ^{-1}$$

where k is a coefficient, and said variable filter coefficient produces a first filter coefficient comprising a first value of k and a second filter coefficient comprising a second value of k.

11. A delta-sigma type analog-to-digital converter according to claim 10, wherein:

said first filter coefficient has a value close to one; and said second filter coefficient has a value equal or close to zero.

12. A delta-sigma type analog-to-digital converter according to claim 11, wherein said second filter coefficient is zero.

13. A delta-sigma type analog-to-digital converter according to claim 10, wherein said one combination of filter coefficient with high cut-off frequency becomes active during powering up of said converter and said variable filter coefficient changes to have a low cut-off frequency after powering up.

14. A delta-sigma type analog-to-digital converter for receiving an analog input signal to generate a digital output signal representing the analog input signal in a digital form, comprising:

(a) a delta-sigma type modulator connected to receive said analog input signal for generating a modulated output;

(b) a decimation filter connected to receive said modulated output for generating a decimation filter output;

(c) a high pass filter connected to receive said decimation filter output for generating a high pass filter output, said high pass filter having a variable filter coefficient during operation; and (d) filter coefficient control means connected to said high pass filter for generating a coefficient control signal for specifying a change in said variable filter coefficient during operation.

15. A delta-sigma type analog-to-digital converter according to claim 14, wherein:

said filter coefficient control means includes timing control means for supplying a first timing signal as said coefficient control signal; and said first timing signal indicates that a predetermined filter coefficient is to be used during a first predetermined period of time after the time said converter is reset.

16. A delta-sigma type analog-to-digital converter according to claim 15, further comprising dither control means for controlling the application of a DC dither component to the input of said delta-sigma modulator.

17. A delta-sigma type analog-to-digital converter according to claim 16, wherein:

said timing control means further generates a second timing signal supplied to said dither control means; and said second timing signal indicates that said DC dither component is not to be applied during a second predetermined period of time after said converter is reset, said second predetermined period of time being shorter than said first predetermined period of time.

18. A method of operating a delta-sigma analog-to-digital converter, comprising the steps of:

(a) applying a power-on-reset signal to the analog-to-digital converter to reset functions of a delta-sigma modulator, decimation filter, and high pass filter of the delta-sigma analog-to-digital converter after electric power is applied to the delta-sigma analog-to-digital converter;

(b) applying a first value of a coefficient control signal to the high pass filter to cause the high pass filter to have a first time constant;

(c) after step (b), providing a DC dither signal in the delta-sigma modulator, the delta-sigma modulator, decimation filter, and high pass filter operating in response to the dither signal to produce a noise signal, the high pass filter operating to cause the noise signal to settle within an amount of time equal to the first time constant;

(d) after the noise signal has settled, applying a second value of the coefficient control signal to the high pass filter to cause the high pass filter to have a second time constant that is substantially larger than the first time constant, and combining an analog input signal with the DC dither signal to produce a DC component including a DC bias signal and a DC offset of the delta-sigma modulator, the delta-sigma modulator, decimation filter, and high pass filter operating to convert the combined analog input signal and DC dither signal to a digital value wherein the high pass filter removes the DC component from an output of the decimation filter within an amount of time equal to the second time constant.

19. The method of claim 18 including disabling an analog input gate in the delta-sigma analog-to-digital converter to prevent the analog input signal from being combined with the DC dither signal and being modulated by the delta-sigma modulator until step (d).

* * * * *